United States Patent [19]

Tanno et al.

[11] Patent Number: 5,073,733
[45] Date of Patent: Dec. 17, 1991

[54] DELAY CIRCUIT WITH MUTING TO PREVENT NOISE DUE TO RANDOM DATA AT OUTPUT

[75] Inventors: Masaya Tanno; Masato Onaya, both of Gunma, Japan

[73] Assignee: Sanyo Electric Co., Ltd., Osaka, Japan

[21] Appl. No.: 510,702

[22] Filed: Apr. 18, 1990

[30] Foreign Application Priority Data

Apr. 20, 1989 [JP] Japan .................... 1-100775

[51] Int. Cl.⁵ .............. H03K 5/159; H03K 3/01; H03K 21/00
[52] U.S. Cl. ................. 307/590; 307/596; 307/602; 328/55; 328/60; 377/42
[58] Field of Search ........... 307/597, 603, 590, 602, 307/596; 328/55, 60; 377/42

[56] References Cited

U.S. PATENT DOCUMENTS

| 3,760,280 | 9/1973 | Covington | 307/603 |
| 4,035,661 | 7/1977 | Carlson | 307/141 |
| 4,468,624 | 8/1984 | Rehbein | 328/55 |
| 4,553,100 | 11/1985 | Nishiura | 328/63 |

FOREIGN PATENT DOCUMENTS 2013379  8/1977  United Kingdom .

Primary Examiner—Stanley D. Miller
Assistant Examiner—Trong Phan
Attorney, Agent, or Firm—Stanger, Michaelson, Spivak & Wallace

[57] ABSTRACT

A delay circuit includes a memory addresses of which is designated by a counter incremented in response to each clock signal from an initial value set by an initial value setting circuit to an end value. A digital signal is written into an address as designated and read and converted into an analog signal to be outputted at an output terminal through a buffer amplifier. A delay time is determined by the writing timing and the reading timing of the digital signal. If the delay time is to be varied in the course of a delaying operation, a further initial value is set in the counter. A control signal for returning the counter in the initial value is generated by a first signal generating circuit when the end value is reached and a setting completion signal is generated by a second signal generating circuit when a setting of the further initial value is completed, and in response to both the signals, a muting signal is generated by a muting signal generating circuit, whereby the buffer amplifier mutes the output signal in response to the muting signal to prevent a noise due to random data from occurring at the output terminal.

5 Claims, 1 Drawing Sheet

DELAY CIRCUIT WITH MUTING TO PREVENT NOISE DUE TO RANDOM DATA AT OUTPUT

BACKGROUND OF THE INVENTION

1. Field of the Invention

The present invention relates to a delay circuit. More specifically, the present invention relates to a delay circuit utilizing a memory and capable of varying a delayed time.

2. Description of the Prior Art

By A/D converting an input analog signal to be written in a memory and by reading the signal being stored in the memory to be D/A converted, it is possible to obtain a delay circuit having a delay time from the writing timing to the reading timing. For example, with respect to addresses of the memory from $A_I$ address to $A_N$ address, if the writing of the signal as A/D converted and reading the same are repeated, it is possible to obtain a delay time equal to clock signals of N, and if the number of addresses being used is changed, it is possible to vary the delay time correspondingly thereto.

In such a delay circuit, if the number of addresses to be used of the memory is changed to vary the delay time in the course of the operation thereof, addresses that have not used until this time become to be newly used. In such a case, since random data are stored in the addresses which become to be newly used, there was a problem that a noise is generated on the output if the random data are read and used as they are.

SUMMARY OF THE INVENTION

Therefore, a principal object of the present invention is to provide a novel delay circuit.

Another object of the invention is to provide a delay circuit using a memory, in which no noise is generated on an output even if addresses of the memory become to be newly used to vary a delay time in the course of an operation thereof.

A delay circuit in accordance with the present invention comprises: an A/D converting circuit for A/D converting an input signal; a memory for storing a digital signal outputted from the A/D converting circuit; a D/A converting circuit for D/A converting an output signal of the memory; a counter for designating addresses to be used of the memory; an initial value setting circuit for initially setting an initial value of the counter; a first signal generating circuit for detecting that an end value of the counter is reached and for generating a control signal; a second signal generating circuit for generating a setting completion signal when an initial value setting operation by the initial value setting circuit is completed; and a muting signal generating circuit for generating a muting signal in response to the setting completion signal and the control signal.

Since the input signal is A/D converted and temporarily stored in the memory and the signal read from the memory is D/A converted to obtain an output, it is possible to constitute a delay circuit in which a time period during when the signal is stored in the memory becomes a delay time. In such a case, since the addresses of the memory are designated by the counter, it is possible to vary a delay amount by controlling a counted value of the counter. An initial value is set in the counter by the initial value setting circuit. When the setting of the initial value is completed, the setting completion signal is generated and, when the end value is reached by the counted value of the counter, the control signal is generated. The muting signal generating circuit generates the muting signal in response to the setting completion signal and the control signal. Therefore, by utilizing the muting signal, it is possible to prevent a noise from being generated at a timing when the initial value is changed to vary the delay time in the course of an operation thereof.

In accordance with the present invention, it is possible to obtain a delay circuit in which a delay time can be arbitrary varied. Furthermore, in such a delay circuit, it is possible to prevent a noise from being generated at an output even when the delay time is varied.

The objects and other objects, features, aspects and advantages of the present invention will become more apparent from the following detailed description of the embodiments of the present invention when taken in conjunction with accompanying drawings.

DETAIL DESCRIPTION OF THE PREFERRED EMBODIMENTS

Figure 1:
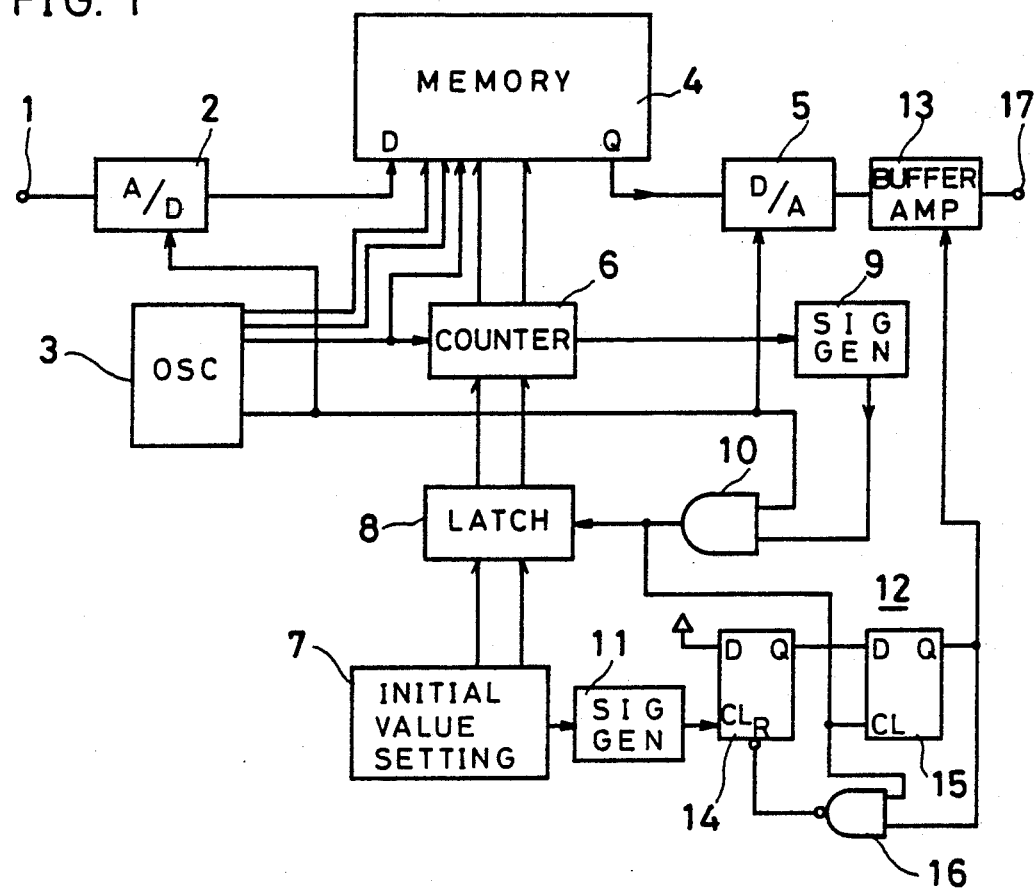
FIG. 1 is a block diagram showing an embodiment in accordance with the present invention.
Figure 2A:
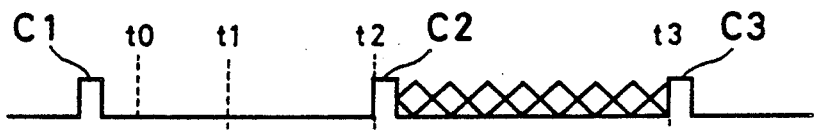
FIG. 2(A)–(D) is a timing chart showing an operation of FIG. 1 embodiment.
Figure 2B:
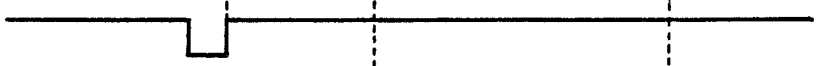
Figure 2C:
Figure 2D:
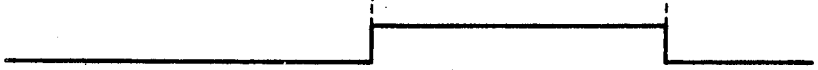

FIG. 1 is a block diagram showing an embodiment in accordance with the present invention. An analog input signal is applied to an input terminal 1, and the analog input signal is converted into a digital signal by an A/D converting circuit 2. A clock signal, writing signal, reading signal and etc. to be applied to respective portions of this embodiment are generated by an oscillator 3. The reference numeral 4 denotes a memory to which an output signal of the A/D converting circuit 2 is stored in response to the writing signal. A digital signal read from the memory in response to the reading signal is converted into an analog signal by a D/A converting circuit 5. The reference numeral 6 denotes a counter for designating addresses to be used in the memory 4. To the counter 6, an initial value is set by an initial value setting circuit 7. More specifically, an output of the initial value setting circuit 7 is latched by a latch circuit 8 to be applied to the counter 6.

A first signal generating circuit 9 detects that an end value is reached by the counter 6 and outputs an output signal in response to such a detection. The output signal of the first signal generating circuit 9 and a clock signal obtained from the oscillator 3 are applied to an AND gate 10 which generates a control signal for controlling the latch circuit 8. A second signal generating circuit 11 generates a setting completion signal when an initial value setting operation by the initial value setting circuit 7 is completed. The control signal generated by the AND gate 10 and the setting completion signal generated by the second signal generating circuit 11 are applied to a muting signal generating circuit 12 which generates a muting signal in response thereto.

In addition, a buffer amplifier 13 is connected between an output of the D/A converting circuit 5 and an output terminal 17.

As shown in FIG. 1, the muting signal generating circuit 12 includes a first D-FF (D-type Flip-Flop) 14, a second D-FF 15 and a NAND gate 16. A data terminal D and a clock terminal CL of the first D-FF 14 are connected to a power source (not shown) and an output terminal of the second signal generating circuit 11, respectively. A data terminal D and a clock terminal CL of the second D-FF 15 are connected to an output Q of the first D-FF 14 and an output of the AND gate 10, respectively. The NAND gate 16 has a first input connected to the output of the AND gate 10, a second input connected to an output Q of the second D-FF 15, and an output connected to a reset R input of the first D-FF 14.

Now, a description will be made on a generic operation of FIG. 1 embodiment. A delay time for the input signal is defined by the number of addresses being used of the memory 4. If the memory 4 has addresses of X and an initial address of addresses to be used is $A_N$, the addresses of X - N are used for delaying the signal and, it is possible to obtain a delay time that is X - N times an interval of address designating clocks.

When the initial value setting circuit 7 is operated to set an initial value of the counter 6, data of the initial value setting circuit 7 is latched by the latch circuit 8, and the initial value is set into the counter 6 by the data outputted from the latch circuit 8.

The counter 6 designates the address of the memory 4 in response to the initial value as set. Therefore, the address ($A_N$, for example) being designated of the memory 4 is brought in a writable or readable state. In such a state, when the reading signal is applied to the memory 4 from the oscillator 3, the data stored in the address $A_N$ is read to a terminal Q of the memory 4, and the data is converted into an analog signal by the D/A converting circuit 5 to be outputted to the output terminal 17 through the buffer amplifier 13.

Thereafter, when the writing signal is applied to the memory 4 from the oscillator 3, the digital signal which was applied to the input terminal 1 and A/D converted by the A/D converting circuit 2 is written in the memory 4.

Then, when the counter 6 is incremented in response to the clock signal from the oscillator 3, the next address $A_N+1$ of the memory 4 is designated so that the data is read and written to or from the address $A_N+1$. Since the counter 6 is sequentially incremented in response to the clock signal from the oscillator 3, the reading and writing operations with respect to all the addresses from $A_N$ to $A_X$ are sequentially performed.

If the end value is reached by the counted value of the counter 6, a signal indicative of that the end value is reached is generated from the first signal generating circuit 9. The signal is passed through the AND gate 10 in response to the clock signal from the oscillator 3 to be applied to the latch circuit 8 as a control signal. Therefore, the output signal of the latch circuit 8 is applied to the counter 6 so that the counted value of the counter 6 is returned to the initial value. Thereafter, the same or similar operations are repeated. Therefore, a signal written into an arbitrary address of the memory 4 is read from the memory after a lapse of a time determined by the intervals of the clock signal and the number of addresses being used of the memory 4, thereby to delay the signal by that time.

Meanwhile, as seen from the above description, in one cyclic period after that the value of the counter 6 is set as the initial value, the random data that is stored in advance in the address being used of the memory 4 is read and outputted through the D/A conversion by the D/A converting circuit 5. An output corresponding to the random data has nothing to do with the input signal, and therefore, the output signal due to the random data becomes a noise with respect to the input signal and to be generated at the output terminal 17.

In the embodiment shown in FIG. 1, such a noise due to the random data can be prevented from being generated, and such a preventing operation will be described with reference to FIG. 2.

At every timing when the end value is reached by the counted value of the counter 6, the control signals C1, C2 and C3 as shown in FIG. 2 (A) are generated. If the initial value setting circuit 7 is operated at a time to in the course of the delaying operation so as to set a further initial value, the output signal between the control signals C2 and C3 is generated based upon the random data, and therefore, a noise occurs.

However, as shown in FIG. 2 (B), the setting completion signal is generated from the second signal generating circuit 11 at a time tl when the setting of the further initial value is completed, to be applied to the first D-FF 14. Therefore, as shown in FIG. 2 (C), the output Q of the first D-FF 14 becomes "H" in response to the rising edge of the setting completion signal. In such a state, when the control signal C2 is generated from the AND gate 10, which is applied to the clock terminal CL of the second D-FF 15 so that the output Q of "H" of the first D-FF 14 is fetched by the second D-FF 15. Therefore, as shown in FIG. 2 (D), the output Q of the second D-FF 15 becomes "H". The Q output of "H" is applied to the buffer amplifier 13 as the muting signal, and therefore, the output signal from the D/A converting circuit 5 is muted by the buffer amplifier 13.

The output Q of the second D-FF 15 is also applied to the NAND gate 16. Then, when the control signal C2 is generated at the output terminal of the AND gate 10, the output of the NAND gate 16 becomes "L". Therefore, the first D-FF 14 is reset, and as shown in FIG. 2 (C), the output Q of the first D-FF 14 becomes "L".

When the control signal C3 is generated from the AND gate 10 at a time t3, the Q output of "L" from the first D-FF 14 is fetched by the second D-FF 15. Therefore, as shown in FIG. 2 (D), the output Q of the second D-FF 15 also becomes "L". Such a series of operation is performed at every timing when the initial value setting circuit 7 is operated.

As understood through comparison of FIG. 2 (A) and FIG. 2 (C), a time period during when the noise due to the random data is generated and a time period during when the muting signal obtained at the output Q of the second D-FF 15 is generated are exactly coincident with each other. Therefore, it is possible to surely prevent a delayed signal including a noise from being generated at the output terminal 17.

In addition, in the embodiment described above, in order to prevent a noise due to random data read from the memory 4 when the initial value is changed from being outputted, the buffer amplifier 13 mutes the output of the D/A converting circuit 5. However, it is easy for those skilled in the art to modify such a circuit configuration. For example, the output from the memory 4 itself may be disabled by a gate circuit when the random data is read from the memory 4, or the output from the D/A converting circuit 5 may be disabled. Therefore, it is to be understood that a specific configuration of a means for preventing a noise due to the random data is not so important for the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay circuit, comprising:
an analog to digital (A/D) converting circuit for A/D converting an input signal;
a memory for storing a digital signal outputted from said A/D converting circuit;
a digital to analog (D/A) converting circuit for D/A converting a digital signal outputted from said memory;
a counter for designating addresses to be used in said memory;
an initial value setting circuit for initially setting an initial value of said counter;
a first signal generating circuit for detecting that an end value of said counter is reached and for generating a control signal;
a second signal generating circuit for generating a setting completion signal when an initial value setting operation by said initial value setting circuit is completed; and
a muting signal generating circuit for generating a muting signal in response to said setting completion signal and said control signal.

2. A delay circuit in accordance with claim 1, further comprising a muting circuit for muting an output of said D/A converting circuit.

3. A delay in accordance with claim 2, wherein said memory is constructed such that a plurality of addresses are sequentially designated in response to each address designating signal obtained from said counter, and a delay time is defined by the number of the addresses as designated.

4. A delay circuit in accordance with claim 3, wherein said muting signal generating circuit includes a first D-Flip Flop having a clock input to which said setting completion signal is applied, a second D-Flip Flop having a data input to which an output signal of said first D-Flip Flop is applied, a clock input to which said control signal is applied, and a gating circuit which generates a reset signal for said first D-Flip Flop in response to said control signal and an output of said second D-Flip Flop and to generate said muting signal at the output of said second D-Flip Flop.

5. A delay circuit,
analog to digital (A/D) converting means for A/D converting an input signal;
memory means for storing a digital signal outputted from said A/D converting means;
digital to analog (D/A) converting means for D/A converting a digital outputted from said memory means;
outputting means as a delayed signal;
counter means for designating addresses to be used of said memory means;
initial value setting means for initially setting an initial value of said counter means;
signal generating means coupled to said counter means for generating a disabling signal; and
disabling means for disabling substantially the output of said memory means to prevent a noise due to a random data read from said memory means from being outputted through said outputting means.

* * * * *